(12) United States Patent
Sekiya

(10) Patent No.: US 7,348,275 B2
(45) Date of Patent: Mar. 25, 2008

(54) PROCESSING METHOD FOR SEMICONDUCTOR WAFER

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/481,002

(22) Filed: Jul. 6, 2006

(65) Prior Publication Data

US 2007/0007247 A1    Jan. 11, 2007

(30) Foreign Application Priority Data

Jul. 11, 2005    (JP) .............................. 2005-201453

(51) Int. Cl.
*H01L 21/302* (2006.01)
(52) U.S. Cl. ...................... 438/690; 438/689; 438/692; 438/464; 438/458; 438/459; 438/460; 438/462; 216/8; 216/13; 216/38
(58) Field of Classification Search ................ 438/689; 216/8
See application file for complete search history.

(56) References Cited

U.S. PATENT DOCUMENTS 7,115,485 B2 * 10/2006 Priewasser .................. 438/464

2003/0003688 A1 * 1/2003 Tandy et al. ................ 438/459

FOREIGN PATENT DOCUMENTS

EP    1484792    * 8/2004

* cited by examiner

*Primary Examiner*—Duy-Vu N. Deo
*Assistant Examiner*—Maki Angdi
(74) *Attorney, Agent, or Firm*—Smith, Gambrell & Russell, LLP

(57) ABSTRACT

A processing method for a semiconductor wafer which is generally circular, and which has on the face thereof an annular surplus region present in an outer peripheral edge portion of the face, and a circular device region surrounded by the surplus region, the device region having many rectangular regions defined by streets arranged in a lattice pattern, each of the rectangular regions having a semiconductor device disposed therein. The processing method includes a back grinding step of grinding a region in the back of the wafer corresponding to the device region to form a circular concavity in the back of the wafer corresponding to the device region.

6 Claims, 4 Drawing Sheets

PROCESSING METHOD FOR SEMICONDUCTOR WAFER

FIELD OF THE INVENTION

This invention relates to a processing method for a semiconductor wafer which is generally circular, and which has on the face thereof a surplus region present in an outer peripheral edge portion of the face, and a circular device region surrounded by the surplus region, the device region having many rectangular regions defined by streets arranged in a lattice pattern, each of the rectangular regions having a semiconductor device disposed therein.

DESCRIPTION OF THE PRIOR ART

As is well known among people skilled in the art, it is common practice in the manufacture of a semiconductor device to dispose many semiconductor devices on the face of a generally circular semiconductor wafer, then grind the back of the wafer to decrease the thickness of the wafer to a required value, then apply an additional treatment, such as forming a thin metal film on the face of the wafer, or forming via holes in each of the rectangular regions, and then dice the wafer to separate the semiconductor devices individually.

In recent times, it is often desired to grind the back of the wafer, thereby rendering the thickness of the wafer markedly small, for example, 50 μm or smaller, for the purpose of downsizing and weight reduction of the semiconductor device. However, if the thickness of the wafer is rendered very small, the rigidity of the wafer is markedly low. Thus, the wafer is difficult to handle during the additional treatment, and the risk of damage to the wafer is also incurred.

SUMMARY OF THE INVENTION

It is a principal object of the present invention, therefore, to provide a novel and improved processing method for a semiconductor wafer, which can avoid difficulty in handling the wafer and can minimize the risk of damaging the wafer, while fulfilling the requirements for downsizing and weight reduction of semiconductor devices.

The inventor conducted in-depth studies, and has noticed that on the face of a semiconductor wafer, there are a surplus region present in an outer peripheral edge portion of the face, and a circular device region surrounded by the surplus region, and many semiconductor devices are disposed in the device region. Based on these facts, the inventor has found that the above principal object can be attained by grinding a region in the back of the wafer corresponding to the device region to form a circular concavity in the back of the wafer in correspondence with the device region, thereby decreasing the thickness of the device region to a required value, but rendering the thickness of the surplus region of the wafer relatively large, instead of grinding the entire back of the wafer to decrease the entire thickness of the wafer; and applying a required additional treatment to the wafer in such a state. After application of the required additional treatment to the wafer, a region in the back of the wafer which surrounds the circular concavity is ground to convert the back of the wafer into a substantially flat surface. Alternatively, the wafer is cut along the outer peripheral edge of the device region to remove the surplus region, and then the wafer is diced along the streets to separate the semiconductor devices individually.

According to an aspect of the present invention, there is provided, as a processing method for a semiconductor wafer for attaining the above principal object, a processing method for a semiconductor wafer which is generally circular, and which has on the face thereof an annular surplus region present in an outer peripheral edge portion of the face, and a circular device region surrounded by the surplus region, the device region having many rectangular regions defined by streets arranged in a lattice pattern, each of the rectangular regions having a semiconductor device disposed therein, the processing method comprising:

a back grinding step of grinding a region in the back of the wafer corresponding to the device region to form a circular concavity in the back of the wafer corresponding to the device region;

an additional treatment step of applying a required additional treatment to the wafer after the back grinding step; and a back flattening step of grinding a region in the back of the wafer surrounding the circular concavity after the additional treatment step, thereby converting the back of the wafer into a substantially flat surface.

According to another aspect of the present invention, there is provided, as a processing method for a semiconductor wafer for attaining the above principal object, a processing method for a semiconductor wafer which is generally circular, and which has on the face thereof an annular surplus region present in an outer peripheral edge portion of the face, and a circular device region surrounded by the surplus region, the device region having many rectangular regions defined by streets arranged in a lattice pattern, each of the rectangular regions having a semiconductor device disposed therein, the processing method comprising:

a back grinding step of grinding a region in the back of the wafer corresponding to the device region to form a circular concavity in the back of the wafer corresponding to the device region;

an additional treatment step of applying a required additional treatment to the wafer after the back grinding step; and a surplus region removal step of cutting the wafer along the outer peripheral edge of the device region after the additional treatment step, thereby removing the surplus region.

Preferably, in the surplus region removal step, a cutting blade being rotationally driven is caused to act along the outer peripheral edge of the device region, thereby cutting the wafer. In this case, it is preferred to fix the wafer onto a chuck table having an annular groove formed on the surface of the chuck table, the annular groove corresponding to the outer peripheral edge of the device region. After the back flattening step or the surplus region removal step, it is advantageous to include a dicing step of dicing the wafer along the streets to separate the semiconductor devices individually.

DETAILED DESCRIPTION OF THE PREFERRED EMBODIMENTS

Preferred embodiments of the processing method for a semiconductor wafer according to the present invention will be described in further detail by reference to the accompanying drawings.

Figure 1:
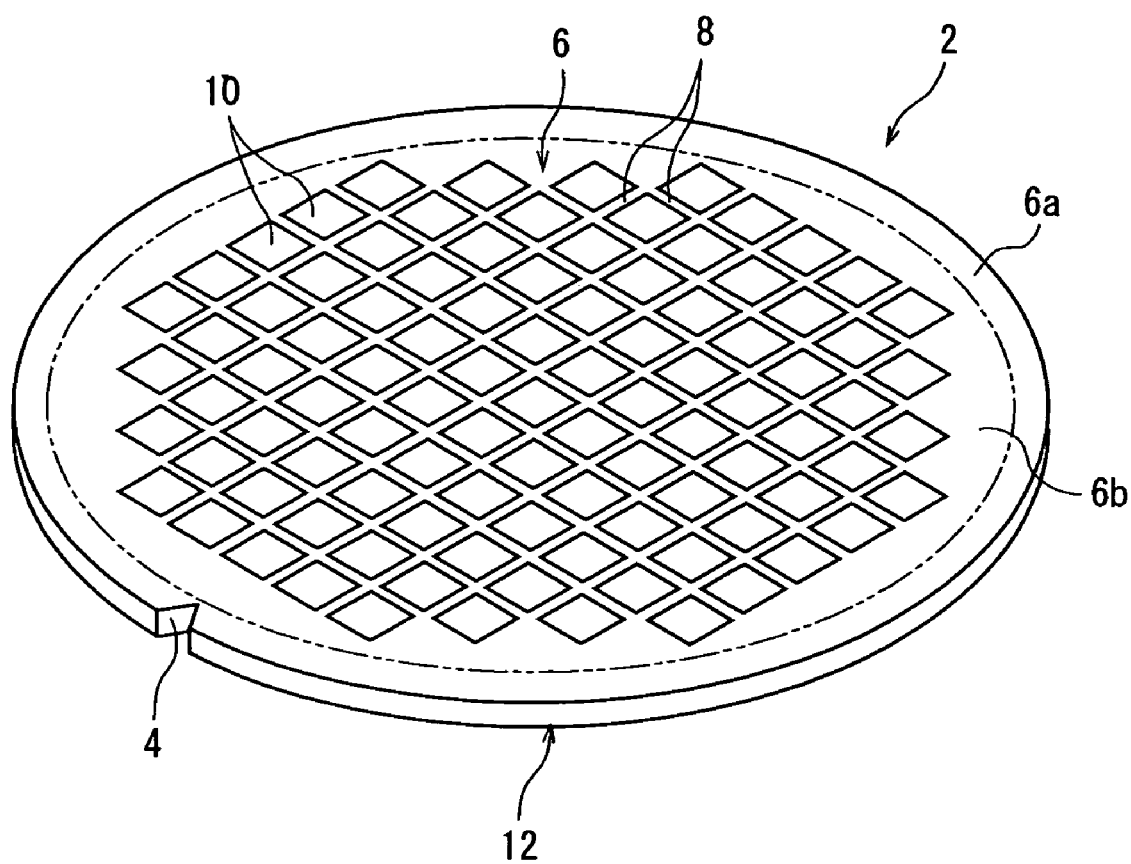
FIG. 1 is a perspective view showing a typical example of a semiconductor wafer before being processed according to the present invention.

FIG. 1 shows a typical example of a semiconductor wafer 2 well known per se, which the processing method of the present invention is applied to. The illustrated wafer 2 is circular as a whole, and has an orientation notch 4 formed in a circumferential edge portion thereof. The thickness of the wafer 2 is uniform throughout, and is preferably 250 μm or more, especially 300 to 700 μm. On the face 6 of the wafer 2 there are an annular surplus region 6a present in an outer peripheral edge portion of the face 6, and a circular device region 6b surrounded with the surplus region 6a. The notch 4 is formed in the annular surplus region 6a. The circular device region 6b has many rectangular regions 10 defined by streets 8 arranged in a lattice pattern, and a semiconductor device is disposed in each of the rectangular regions 10.

Figure 2:
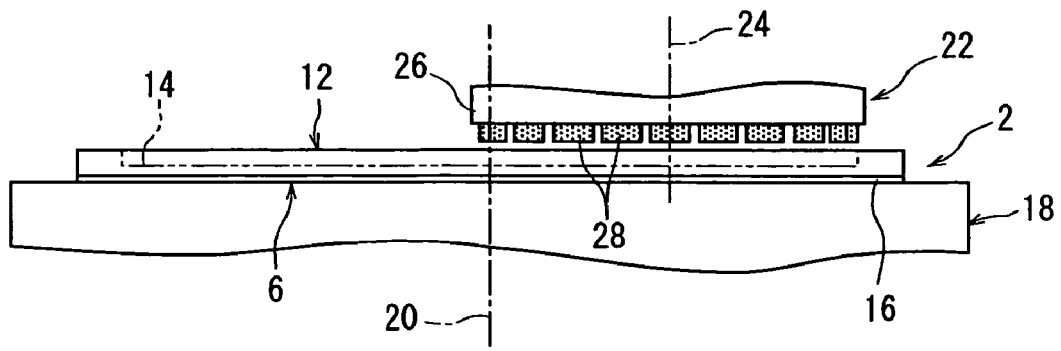
FIG. 2 is a schematic front view showing a mode of a back grinding step in which the back of the wafer in FIG. 1 is ground to form a circular concavity.

In the present invention, a circular concavity 14 (FIG. 4) is formed in the back 12 of the wafer 2 in correspondence with the circular device region 6b. With reference to FIG. 2 showing a preferred method for forming the circular concavity 14, a protective tape 16, which may be a suitable plastic film, is stuck to the face 6 of the wafer 2. Such a wafer 2 is placed on a substantially horizontal upper surface of a chuck table 18, with the wafer 2 being facedown, namely, the back 12 of the wafer 2 being exposed upward. The chuck table 18 is mounted to be rotatable about a central axis 20 extending vertically, and is rotated by a rotational drive source (not shown). The chuck table 18 is formed of a porous material, or a suction hole or groove (not shown) is formed in the surface of the chuck table 18. Thus, the wafer 2 is attracted under vacuum onto the chuck table 18 by connecting the chuck table 18 to a suitable suction source (not shown).

A grinding tool 22 is caused to act on the back 12 of the wafer 2 attracted onto the chuck table 18 to form the circular concavity 14 in the back 12 of the wafer 2. The grinding tool 22 is mounted to be rotatable about a central axis 24 extending vertically, and is rotated at a high speed by a rotational drive source (not shown). The illustrated grinding tool 22 includes a support member 26 having a cylindrical lower end portion, and a plurality of grinding members 28 fixed to the lower end surface of the support member 26. The grinding members 28, which can be formed from diamond grains bonded together by a suitable bonding material, are each arcuate, and arranged with spacing in the circumferential direction to assume a toroidal form as a whole. Instead of the plural grinding members 28 each of an arcuate shape, a single toroidal grinding member (not shown) can be fixed to the lower surface of the support member 26.

Figure 3:
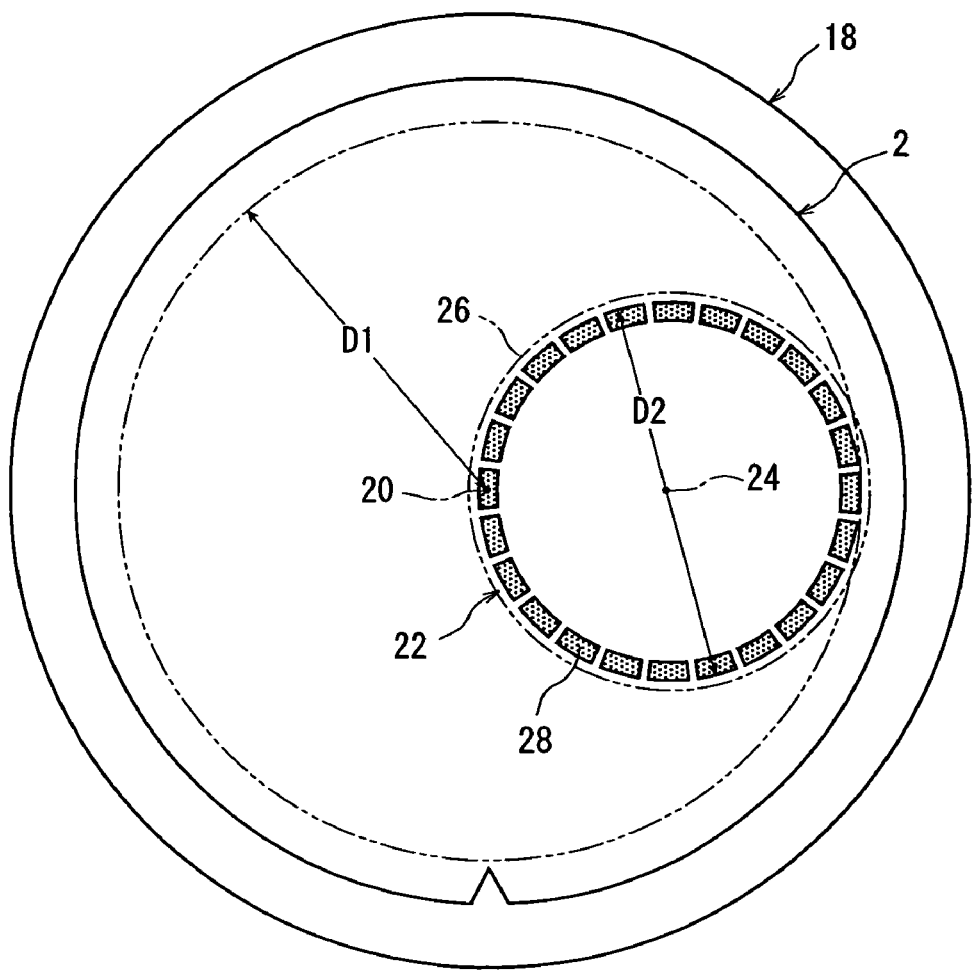
FIG. 3 is a schematic plan view showing the relationship between the wafer and grinding members of a grinding tool when the back of a wafer 2 is ground in the mode shown in FIG. 2.
Figure 4:
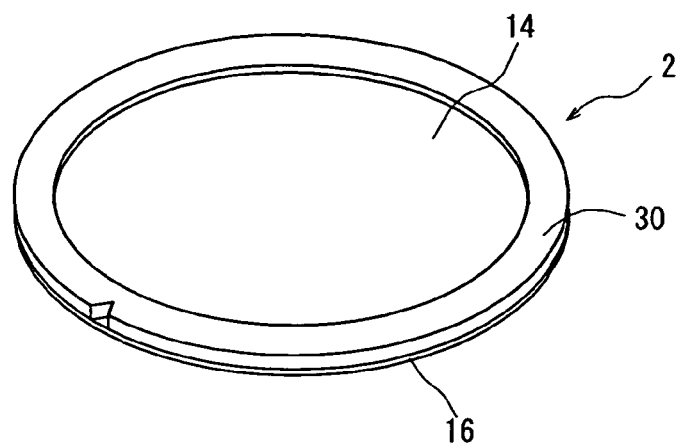
FIG. 4 is a perspective view showing the wafer facedown, the wafer having the circular concavity formed in the back thereof.

Preferably, there is used the grinding tool 22 in which the outer diameter D2 of the grinding members 28 is somewhat larger than the radius D1 of the circular concavity 14 to be formed. As shown in FIGS. 2 and 3, the grinding tool 22 is positioned relative to the wafer 2 such that in a plan view, the outer peripheral edge of the grinding members 28 is inscribed in the outer peripheral edge of the device region 6b (accordingly, the inner peripheral edge of the circular concavity 14 to be formed), and the grinding member 28 straddles the central axis 20 of the wafer 2. In this state, the chuck table 18 is rotated about the central axis 20, the grinding tool 22 is rotated about the central axis 24, and the grinding tool 22 is gradually moved toward the wafer 2, namely, lowered. In this manner, the back 12 of the wafer 2 is ground in correspondence with the device region 6b to form the circular concavity 14. The thickness of the wafer 2 in the device region 6b after formation of the circular concavity 14 is preferably 100 μm or less, especially 30 to 50 μm. FIG. 4 shows the wafer 2 facedown, the wafer 2 having the circular concavity 14 formed in the back 12. In the wafer 2 shown in FIG. 4, the device region 6b is markedly thin, whereas the annular surplus region 6a surrounding the device region 6b is relatively thick, so that the wafer 2 as a whole has adequate rigidity.

If desired, it is possible to form the circular concavity 14 in the back 12 of the wafer 2 by plasma etching, sputter etching, or chemical-mechanical-polishing, instead of forming the circular concavity 14 in the back 12 of the wafer 2 by grinding.

The wafer 2 having the circular concavity 14 formed in the back 12 is subjected to a required additional treatment. Examples of the additional treatment are thin metal film formation for forming a thin film comprising a metal, such as gold, silver or titanium, at least on the bottom surface of the circular concavity 14 in the back 12 of the wafer 2, and via hole formation for forming a plurality of via holes in each of the rectangular regions 10 defined in the device region 6b. Since such an additional treatment per se is well known among people skilled in the art, a detailed description of the additional treatment is omitted herein. In applying the required additional treatment to the wafer 2, an operation, such as transport of the wafer 2, can be performed sufficiently easily, and the risk of damage to the wafer 2 can be fully avoided, because the rigidity of the wafer 2 is relatively great owing to the presence of the annular surplus region 6a having a relatively large thickness.

Figure 5:
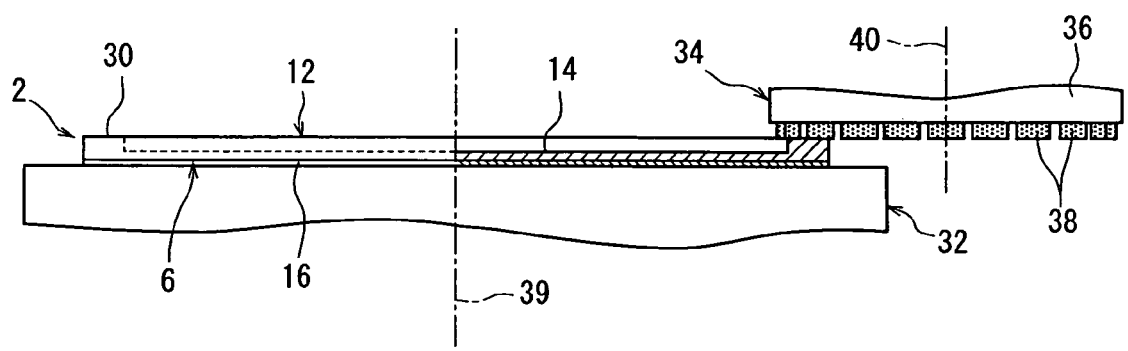
FIG. 5 is a partly sectional schematic front view showing a mode of a back flattening step in which the back of the wafer in FIG. 4 is converted into a flat surface.
Figure 6:
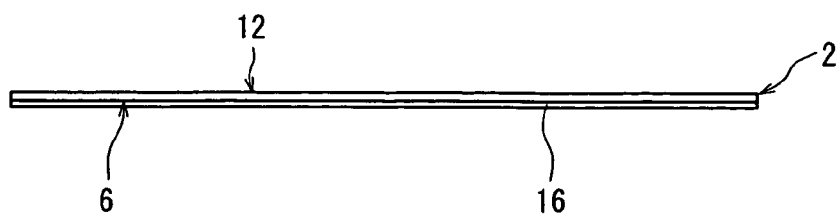
FIG. 6 is a front view showing the wafer facedown, the wafer having the back flattened.

After the required additional treatment is performed for the wafer 2, it is possible to carry out a back flattening step of grinding an annular region 30 in the back 12 of the wafer 2, which surrounds the circular concavity 14, thereby substantially flattening the back 12 of the wafer 2. FIG. 5 shows a preferred mode of the back flattening step. In FIG. 5, the wafer 2 is placed on a chuck table 32, with the wafer 2 being facedown, namely, the back 12 being exposed upward, the wafer 2 having the protective tape 16 stuck to the face 6 and the circular concavity 14 formed in the back 12. The chuck table 32 is substantially the same as the chuck table 18 shown in FIG. 2, and the wafer 2 is vacuum attracted onto the chuck table 32. A grinding tool 34 is caused to act on the annular region 30 in the back 12 of the wafer 2 to grind the annular region 30, thereby substantially flattening the entire back 12 of the wafer 2 as shown in FIG. 6. The grinding tool 34 may be substantially the same as the grinding tool 22 shown in FIG. 2, and includes a support member 36 having a cylindrical lower end portion, and grinding members 38 fixed to the lower end of the support member 36. As shown in FIG. 5, the grinding members 38 of the grinding tool 34 are located in the annular region 30 in the back 12 of the wafer 2. The chuck table 32 is rotated about its central axis 39, the grinding tool 34 is rotated at a high speed about its central axis 40, and the grinding tool 34 is lowered as appropriate. As a result, the annular region 30 in the back 12 of the wafer 2 is ground until the upper surface of the annular region 30 coincides with the surface of the circular concavity 14. FIG. 6 shows the wafer 2 facedown, with the back 12 of the wafer 2 being flattened.

Figure 7:
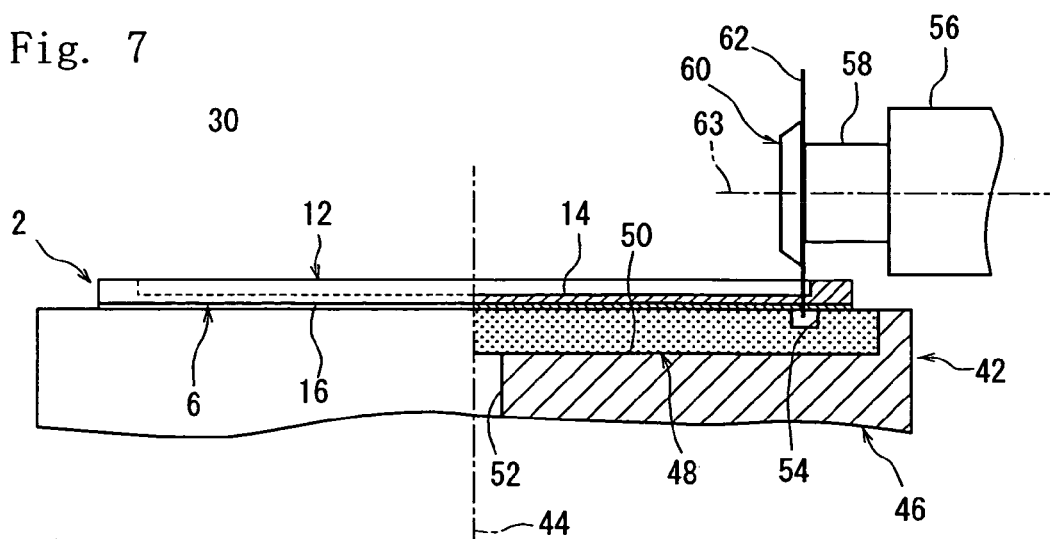
FIG. 7 is a partly sectional schematic front view showing a mode of a surplus region removal step in which a surplus region of the wafer in FIG. 4 is removed.

FIG. 7 shows a preferred mode of a surplus region removal step which can be performed instead of the above-described back flattening step. In the preferred mode shown in FIG. 7, the wafer 2 having the protective tape 16 stuck to the face 6 thereof and having the circular concavity 14 formed in the back 12 thereof is placed on a chuck table 42 facedown, namely, with the back 12 being exposed upward. The chuck table 42 has a rotary susceptor 46 mounted to be rotatable about a central axis 44, and a chuck plate 48. A circular concavity 50 is formed in the upper surface of the rotary susceptor 46, and a communication hole 52 extending vertically is formed at the center of the rotary susceptor 46. The chuck plate 48 is formed from a porous material, and has a circular shape corresponding to the circular concavity 50. This chuck plate 48 is fixed within the circular concavity 50 of the rotary susceptor 46 by a suitable fixing means such as an adhesive. An annular groove 54 is formed in the upper surface of the chuck plate 48. The wafer 2 is placed on the chuck plate 48, with the circumferential edge of the circular concavity 14 formed in the back 12 being brought into correspondence with the annular groove 54 of the chuck plate 48. Suction of the air through the communication hole 52 of the rotary susceptor 46 results in the vacuum attraction of the wafer 2 onto the chuck plate 48.

With further reference to FIG. 7, a spindle 58 extending substantially horizontally is rotatably mounted on a support frame 56 mounted to be movable in an up-and-down direction and a right-to-left direction in FIG. 7. A cutting implement 60 is fixed to the front end of the spindle 58 by a suitable fastening means (not shown) such as a fastening bolt. The cutting implement 60 has an annular ultrathin cutting blade 62 which can be formed from diamond grains bonded together by a suitable bonding agent.

Figure 8:
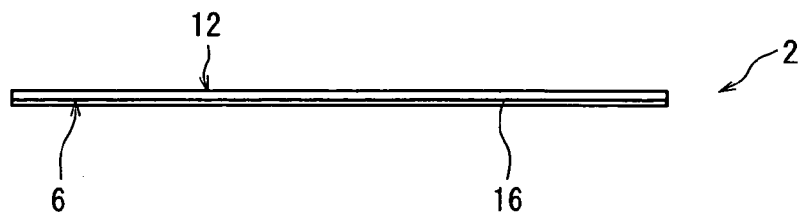
FIG. 8 is a front view showing the wafer facedown, the wafer being rid of the surplus region.

In the surplus region removal step, the chuck table 42 is rotated about the central axis 44 by a suitable rotational drive source (not shown), and the spindle 58 is rotated at a high speed about a central axis 63 by a suitable rotational drive source (not shown). The cutting blade 62 is positioned at the circumferential edge of the circular concavity 14 formed in the back of the wafer 2, and is lowered until the cutting blade 62 pierces through the wafer 2 and enters the annular groove 54 formed in the chuck plate 48. In this manner, the wafer 2 is cut along the circumferential edge of the circular concavity 14, whereby the annular surplus region 6a (FIG. 1) is removed from the device region 6b (FIG. 1). FIG. 8 shows the wafer 2 facedown, with the wafer 2 being rid of the surplus region 6a.

Figure 9:
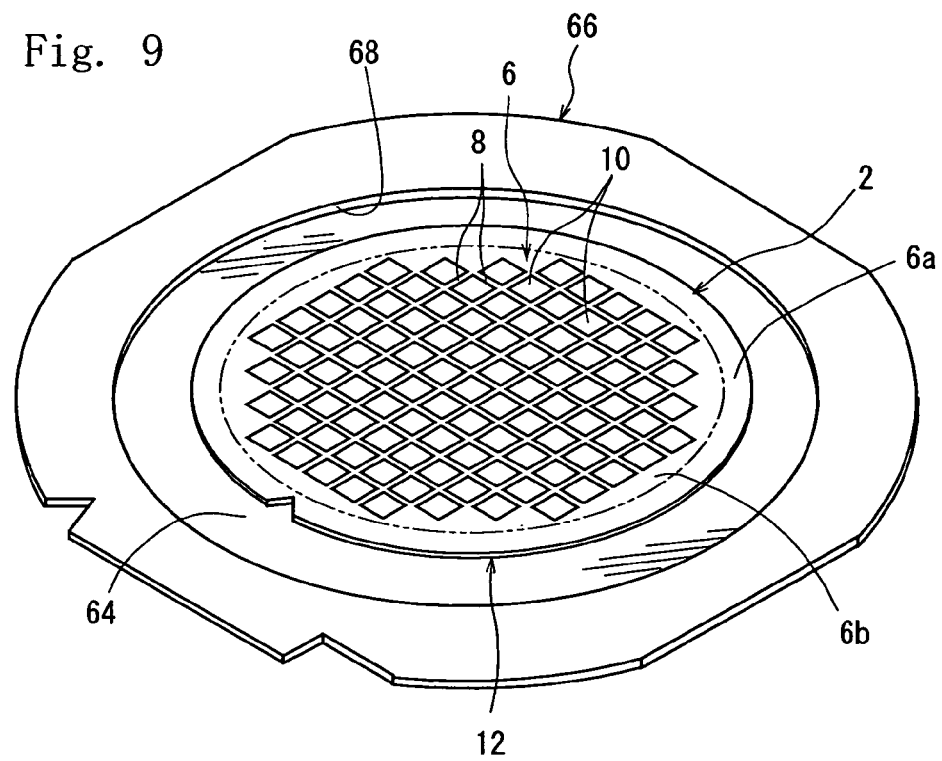
FIG. 9 is a perspective view for illustrating a mode of dicing the wafer of FIG. 6 along streets.

After the back flattening step or the surplus region removal step is carried out, it is possible to perform a dicing step of dicing the wafer 2, namely, cutting the wafer 2 along the streets 8 arranged in a lattice pattern in the device region 6b on the face 6, thereby separating the rectangular regions 10 individually. In one mode of the dicing step well known per se, after the protective tape 16 is detached from the face of the wafer 2, the wafer 2 is mounted on a frame 66 via a mounting tape 64, as shown in FIG. 9. In more detail, the frame 66, which can be formed from a plate of a metal such as aluminum or a suitable synthetic resin, has a mounting opening 68 at its central part. The wafer 2 having the back 12 flattened is positioned within the mounting opening 68, and the mounting tape 64 is stuck across the back of the frame 66 and the back 12 of the wafer 2, with the result that the wafer 2 is mounted on the frame 66. The wafer 2 mounted on the frame 66 can be diced, namely, cut along the streets 8 in the device region 6b, by a well known cutting machine called a dicer. Preferred examples of the dicer are those having as a cutting means a ring-shaped ultrathin cutting blade comprising diamond grains bonded together using a suitable bonding agent, or those having a pulsed laser beam irradiation means as a cutting means. FIG. 9 shows the wafer 2 having the back 12 flattened in the back flattening step. However, the wafer 2 rid of the surplus region 6a in the surplus region removal step can be diced similarly.

While the preferred embodiments of the processing method for a semiconductor wafer according to the present invention have been described in detail by reference to the accompanying drawings, it is to be understood that the invention is not limited to such embodiments, but various changes and modifications may be made without departing from the scope of the invention.

What I claim is:

1. A processing method for a semiconductor wafer which is generally circular, and which has on a face thereof an annular surplus region present in an outer peripheral edge portion of the face, and a circular device region surrounded by the surplus region, the device region having many rectangular regions defined by streets arranged in a lattice pattern, each of the rectangular regions having a semiconductor device disposed therein, the processing method comprising:
a back grinding step of grinding a region in a back of the wafer corresponding to the device region to form a circular concavity in the back of the wafer corresponding to the device region;
an additional treatment step of applying a required additional treatment to the wafer after the back grinding step; and
a back flattening step of grinding a region in the back of the wafer surrounding the circular concavity after the additional treatment step, thereby converting the back of the wafer into a substantially flat surface.

2. The processing method for a semiconductor wafer according to claim 1, further comprising a dicing step of dicing the wafer along the streets after the back flattening step, thereby separating the semiconductor devices individually.

3. A processing method for a semiconductor wafer which is generally circular, and which has on a face thereof an annular surplus region present in an outer peripheral edge portion of the face, and a circular device region surrounded by the surplus region, the device region having many rectangular regions defined by streets arranged in a lattice pattern, each of the rectangular regions having a semiconductor device disposed therein, the processing method comprising:
a back grinding step of grinding a region in a back of the wafer corresponding to the device region to form a circular concavity in the back of the wafer corresponding to the device region;

an additional treatment step of applying a required additional treatment to the wafer after the back grinding step; and a surplus region removal step of cutting the wafer along an outer peripheral edge of the device region after the additional treatment step, thereby removing the surplus region.

4. The processing method for a semiconductor wafer according to claim 3, wherein in the surplus region removal step, a cutting blade being rotationally driven is caused to act along the outer peripheral edge of the device region, thereby cutting the wafer.

5. The processing method for a semiconductor wafer according to claim 4, wherein in the surplus region removal step, the wafer is fixed onto a chuck table having an annular groove formed on a surface of the chuck table, the annular groove corresponding to the outer peripheral edge of the device region.

6. The processing method for a semiconductor wafer according to claim 3, further comprising a dicing step of dicing the wafer along the streets after the surplus region removal step, thereby separating the semiconductor devices individually.

* * * * *